United States Patent
Choi et al.

(10) Patent No.: US 8,697,501 B1
(45) Date of Patent: Apr. 15, 2014

(54) SEMICONDUCTOR DEVICE HAVING A GATE FORMED ON A UNIFORM SURFACE AND METHOD FOR FORMING THE SAME

(71) Applicant: GLOBALFOUNDRIES Inc., Grand Cayman (KY)

(72) Inventors: Dae-han Choi, Loundonville, NY (US); Dae Geun Yang, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/693,094

(22) Filed: Dec. 4, 2012

(51) Int. Cl.
*H01L 21/00* (2006.01)

(52) U.S. Cl.
USPC .................. 438/151; 438/289; 257/255

(58) Field of Classification Search
None
See application file for complete search history.

(56) References Cited

U.S. PATENT DOCUMENTS

| | | | |
|---|---|---|---|
| 2011/0193141 A1* | 8/2011 | Lin et al. ............... | 257/255 |
| 2012/0313170 A1* | 12/2012 | Chang et al. ............ | 257/347 |
| 2013/0137234 A1* | 5/2013 | Baars et al. ............. | 438/289 |

* cited by examiner

*Primary Examiner* — Charles Garber
*Assistant Examiner* — Syed Gheyas
(74) *Attorney, Agent, or Firm* — Darrell L. Pogue; Keohane & D'Alessandro, PLLC (57) ABSTRACT

Aspects of the present invention generally relate to approaches for forming a semiconductor device (e.g., FinFET device) having a gate structure formed on a planar surface thereof. Specifically, a uniform, oxide-fin (OF) surface is formed. Then, a "dummy" gate structure and a set of spacers are formed thereon. Once the gate structure and set of spacers have been formed, the OF surface may be recessed. In one embodiment, the OF surface is uniformly recessed. In another embodiment, the OF surface is selectively recessed to yield a set of fins. In any event, after the recessing, an epitaxial layer is grown and an oxide fill is performed. Then, the "dummy" gate structure is removed (from between the set of spacers) and an oxide recess is performed to yield a set of channel fins between the spacers.

20 Claims, 8 Drawing Sheets

SEMICONDUCTOR DEVICE HAVING A GATE FORMED ON A UNIFORM SURFACE AND METHOD FOR FORMING THE SAME

BACKGROUND

1. Technical Field

This invention relates generally to the field of semiconductors and, more particularly, to approaches for forming a gate structure on a planar/uniform surface during FinFET device formation.

2. Related Art

As the semiconductor industry attempts to integrate smaller technology, a transition from planar complimentary metal-oxide semiconductor (CMOS) transistors to a three-dimensional (3D) FinFET device architecture has been considered. Relative to planar transistors, FinFETs offer improved channel control and, therefore, reduced short channel effects. When forming FinFET devices, gate structures and/or dummy gates are typically formed on non-planar/topographic surfaces. Specifically, existing approaches form fin surfaces prior to forming gate structures. Such an approach often results in uneven gate formation and degraded device performance.

SUMMARY

In general, aspects of the present invention generally relate to approaches for forming a semiconductor device (e.g., FinFET device) having a gate structure formed on a planar/uniform surface thereof. Specifically, a uniform, oxide-fin (OF) surface is formed. Then, a "dummy" gate structure and a set of spacers are formed thereon. Once the gate structure and set of spacers have been formed, the OF surface may be recessed. In one embodiment, the OF surface is uniformly recessed. In another embodiment, the OF surface is selectively recessed to yield a set of fins. In any event, after the recessing, an epitaxial layer is grown and an oxide fill is performed. Then, the "dummy" gate structure is removed (from between the set of spacers) and an oxide recess is performed to yield a set of channel fins between the spacers.

A first aspect of the present invention provides a method of forming a semiconductor device, comprising: forming a dummy gate stack and a set of spacers on an oxide-fin surface, the oxide-fin surface comprising a uniform surface; performing a recessing of at least a portion of the oxide-fin surface; growing an epitaxial layer after the recessing; and removing the dummy gate stack from between the set of spacers.

A second aspect of the present invention provides a method of forming a semiconductor device, comprising: forming a uniform, oxide-fin surface; forming a dummy gate stack between a set of spacers on the uniform, oxide-fin surface; recessing of at least a portion of the uniform, oxide-fin surface; growing an epitaxial layer after the recessing; and removing the dummy gate stack from between the set of spacers.

A third aspect of the present invention provides a method of forming a semiconductor device, comprising: forming a uniform, oxide-fin surface; forming a dummy gate stack between a set of spacers on the uniform, oxide-fin surface; recessing of at least a portion of the uniform, oxide-fin surface; growing an epitaxial layer after the recessing; performing an oxide fill between after the growing; removing the dummy gate stack from between the set of spacers; and recessing the uniform, oxide fin surface between the set of spacers after the removing to reveal a set of fins.

BRIEF DESCRIPTION OF THE DRAWINGS

These and other features of this invention will be more readily understood from the following detailed description of the various aspects of the invention taken in conjunction with the accompanying drawings in which.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, aspects of the present invention generally relate to approaches for forming a semiconductor device (e.g., FinFET device) having a gate structure formed on a planar surface thereof. Specifically, a uniform, oxide-fin (OF) surface is formed. Then, a "dummy" gate structure and a set of spacers are formed thereon. Once the gate structure and set of spacers have been formed, the OF surface may be recessed. In one embodiment, the OF surface is uniformly recessed. In another embodiment, the OF surface is selectively recessed to yield a set of fins. In any event, after the recessing, an epitaxial layer is grown and an oxide fill is performed. Then, the "dummy" gate structure is removed (from between the set of spacers) and an oxide recess is performed to yield a set of channel fins between the spacers.

Under previous approaches, gate structures were typically formed on non-planar/topographic surfaces. Specifically, existing approaches formed fins (e.g., via a reactive ion etch (RIE) process), deposited a gate element and/or set of spacers, and then processed the gate/spacers. Such an approach often resulted in uneven gate formation and degraded device performance.

Figure 1:
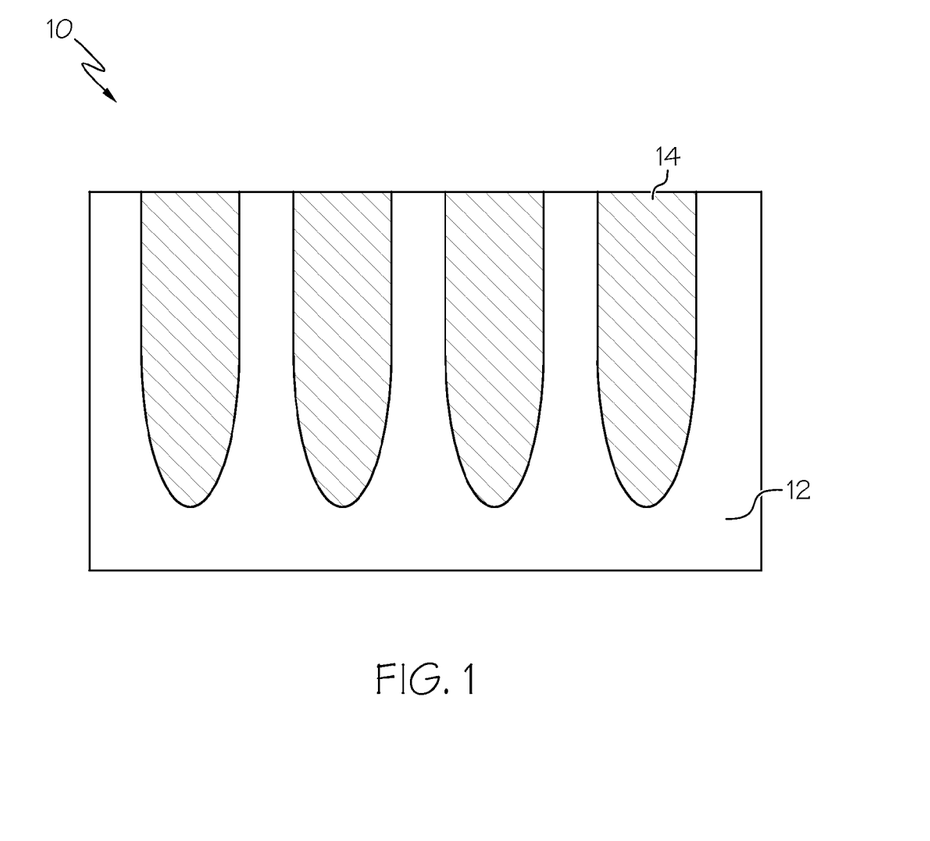
FIG. 1 shows a uniform, oxide-fin surface of a semiconductor device according to an embodiment of the present invention.
Figure 2:
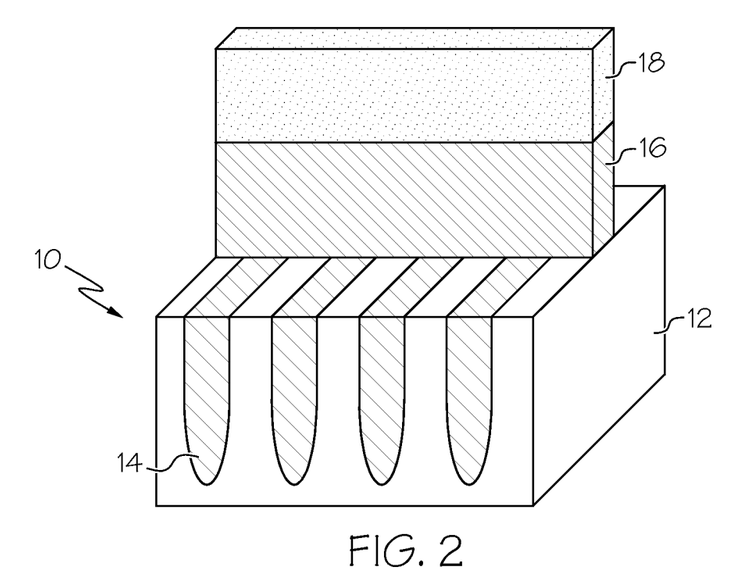
FIG. 2 shows a "dummy" gate formation according to an embodiment of the present invention.
Figure 3:
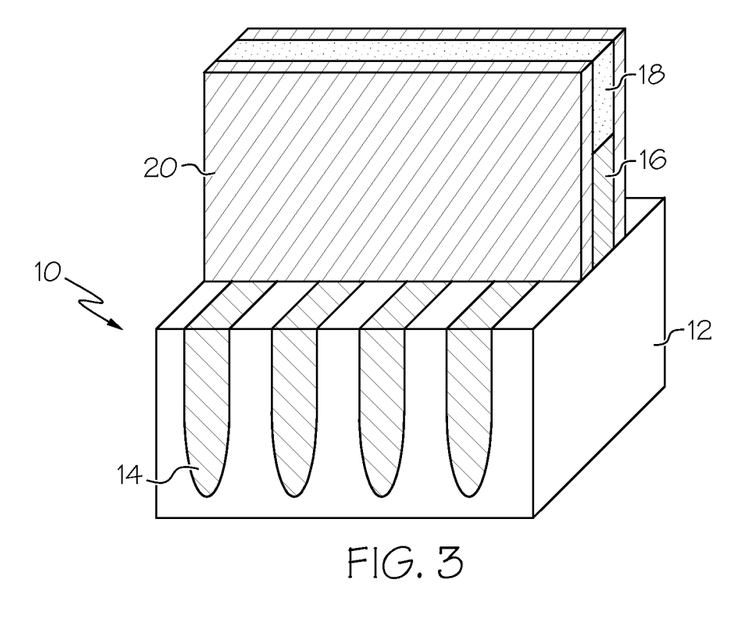
FIG. 3 shows a spacer formation according to an embodiment of the present invention.

Referring now to FIG. 1, an initial formation stage of a semiconductor device is shown. As depicted, the device generally comprises a uniform, oxide-fin surface 10 having a fin region 12 and an oxide fill 14. In general, surface 10 is formed by polishing (e.g., via CMP) oxide fill 14 to a top surface of fin region 12. This results in a "planar" or "uniform" surface. In FIG. 2, a dummy gate formation process is commenced. Specifically, a gate material 16 and a hard mask layer 18 are positioned on surface 10 (collectively referred to as a gate structure or "dummy" gate). In FIG. 3, a set of spacers 20 are added to opposing sides of the gate structure.

Figure 4:
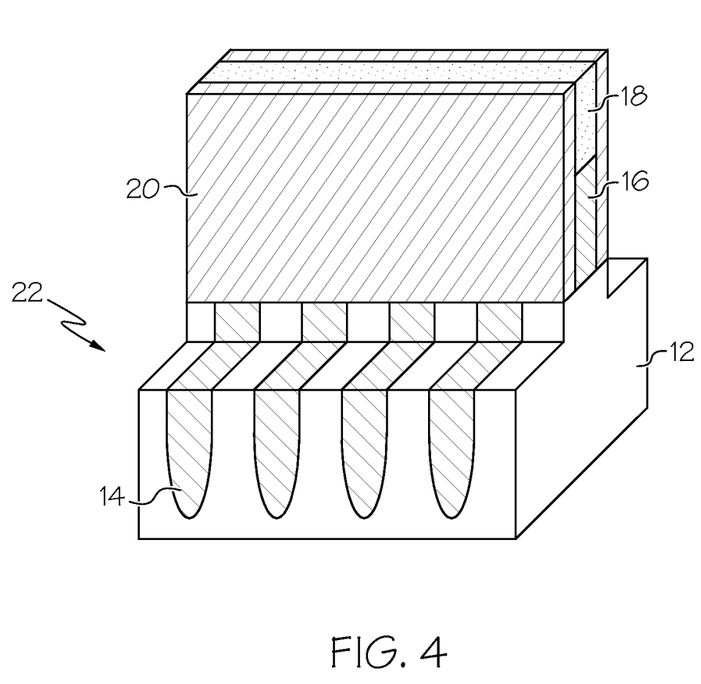
FIG. 4 shows a unified recessing process of the device of FIG. 3 according to an embodiment of the present invention.
Figure 5A:
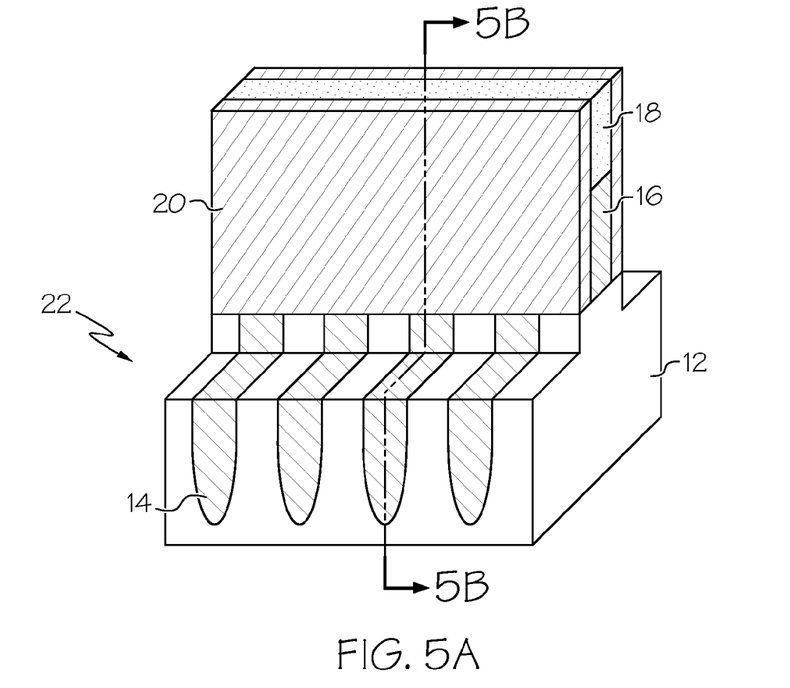
FIGS. 5A-B show a cross-section of the device of FIG. 4 according to an embodiment of the present invention.
Figure 5B:
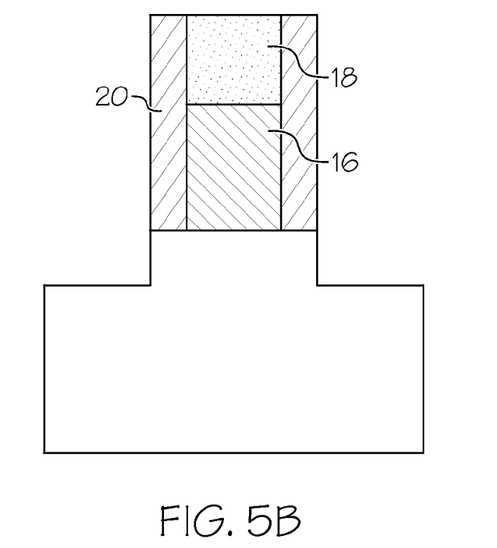
Figure 6A:
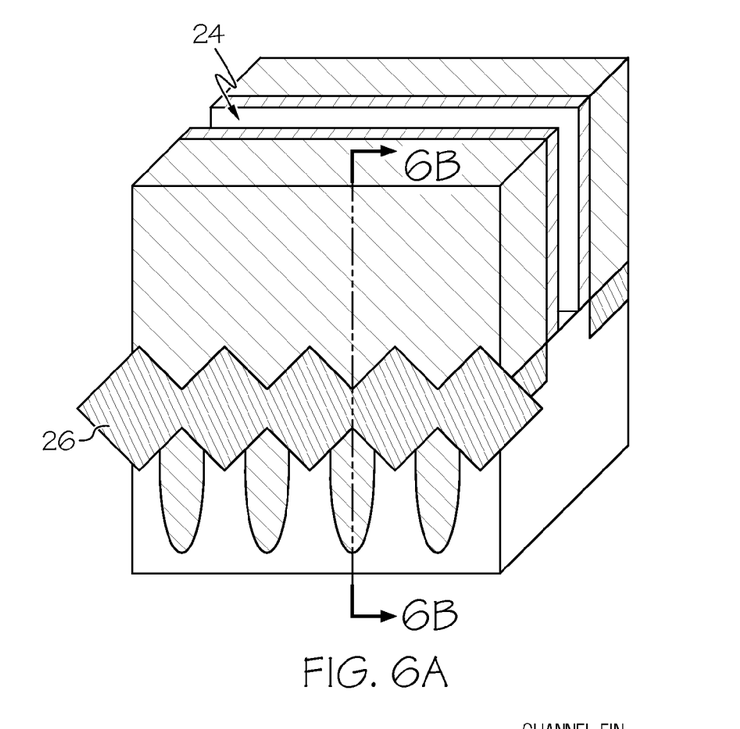
FIGS. 6A-B show the growing of an epitaxial layer and dummy gate removal according to an embodiment of the present invention.
Figure 6B:
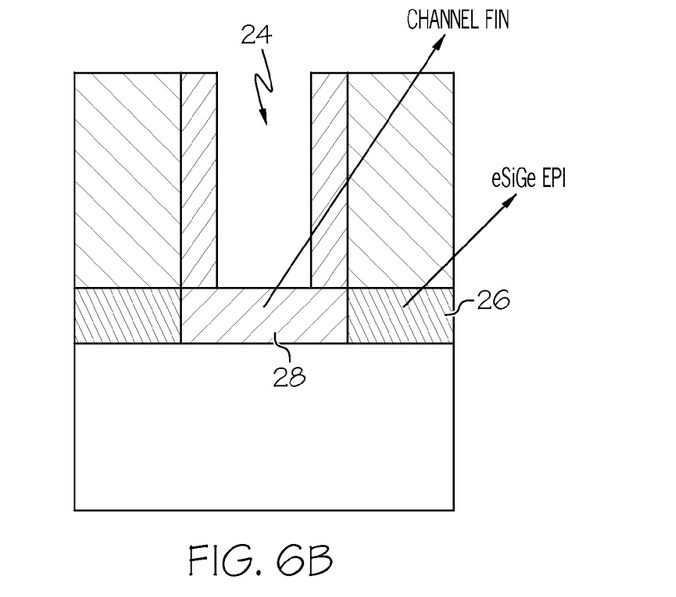

Referring to FIG. 4, a first device recessing approach according to an embodiment of the present invention is shown. Under this approach, surface 10 (e.g., fins 12 and oxide fill 14) is uniformly recessed to form surface 22 in which fins 12 and oxide fill 14 remain planar/flush. A cross-section of the device of FIG. 4 is shown in FIGS. 5A-B. Specifically, FIG. 5B shows a cross-section along lines A-B of FIG. 5A showing surface 22 of fins 12 and oxide fill 14 (as well as gate 16, hard mask 18, and spacer(s) 20). Then, as shown in FIGS. 6A-B, an epitaxial layer 26 (e.g., (e) silicon germanium SiGe) is formed, an oxide fill is performed, the gate structure is removed to create channel 24, and the oxide layer within channel 24 is recessed to yield gate/channel fin(s) 28.

Figure 7:
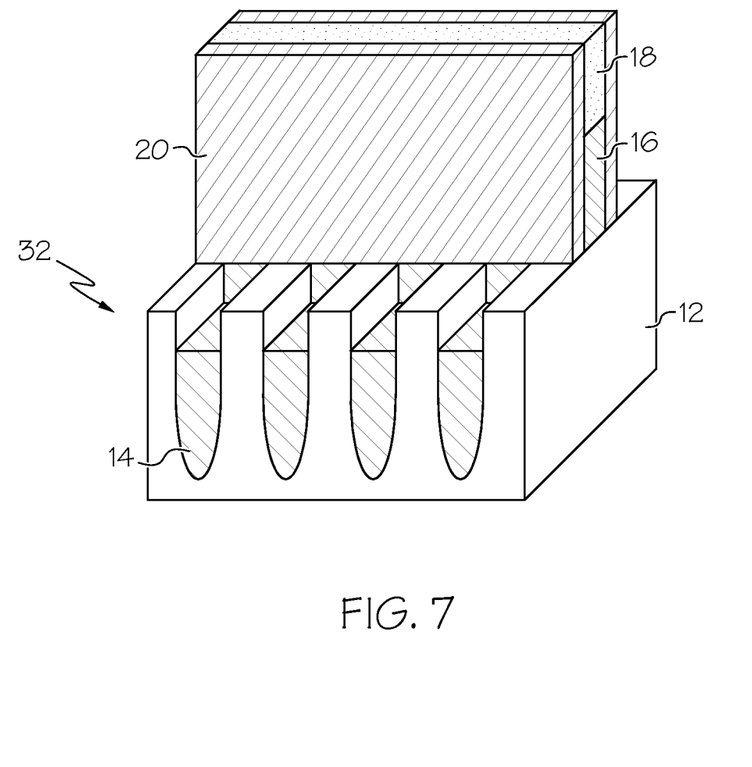
FIG. 7 shows a selective recessing process of the device of FIG. 3 according to an embodiment of the present invention.
Figure 8A:
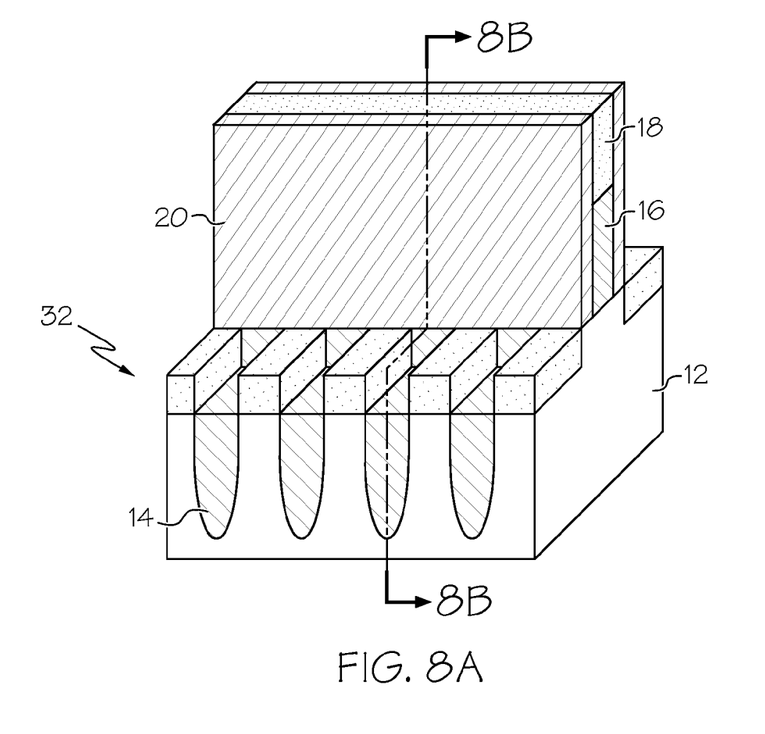
FIGS. 8A-B show a cross-section of the device of FIG. 7 according to an embodiment of the present invention.
Figure 8B:
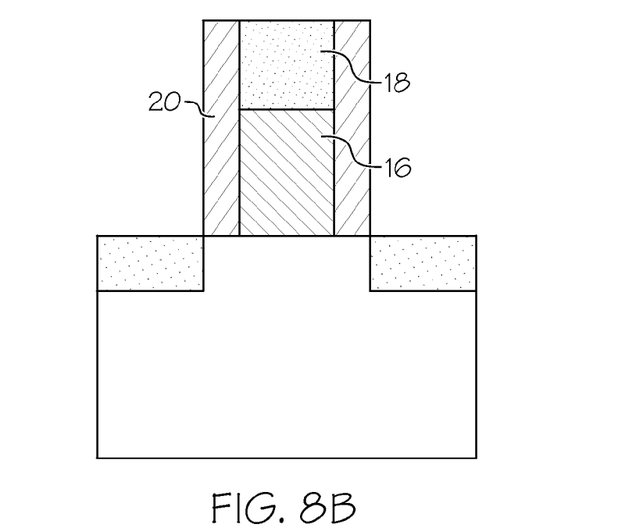
Figure 9A:
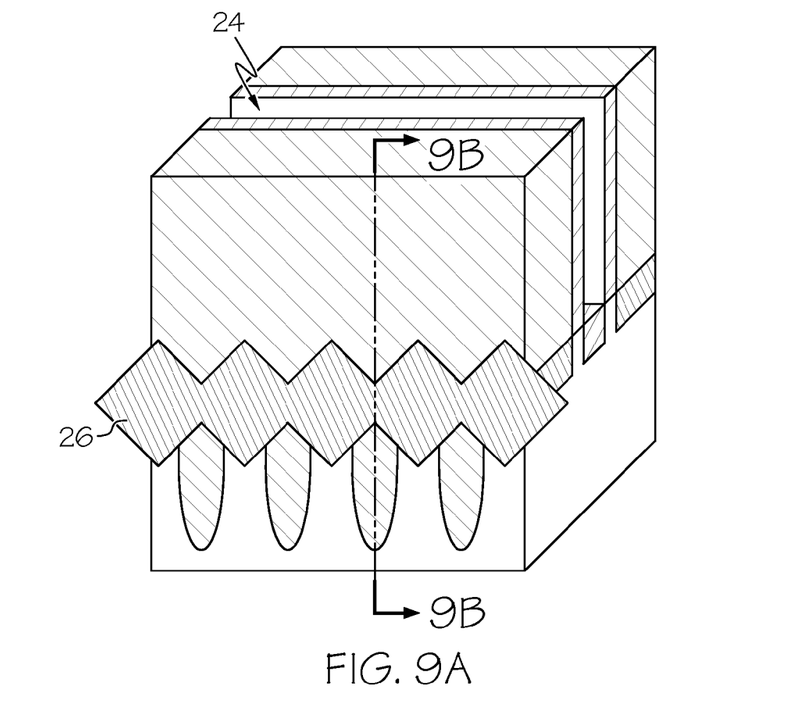
FIGS. 9A-B show the growing of an epitaxial layer and dummy gate removal according to an embodiment of the present invention.
Figure 9B:
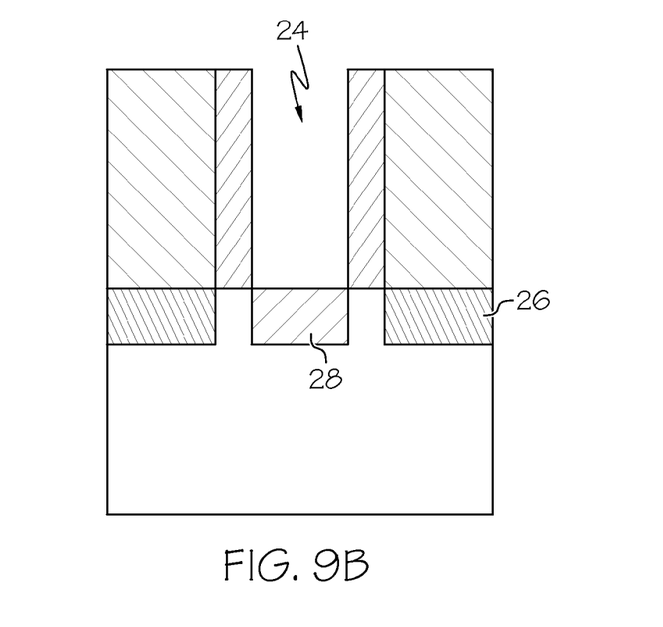

Referring to FIG. 7, another device recessing approach according to an embodiment of the present invention is shown. Under this approach, surface 10 (e.g., fins 12 and oxide fill 14) is selectively recessed to form a fin-shaped surface 32 in which fins 12 and oxide fill 14 are non-planar/topographic with respect to one another. A cross-section of the device of FIG. 7 is shown in FIGS. 8A-B. Specifically, FIG. 8B shows a cross-section along lines A-B of FIG. 8A showing surface 32 of fins 12 and oxide fill 14 (as well as gate 16, hard mask 18, and spacer(s) 20). Then, as shown in FIGS. 9A-B, an epitaxial layer 26 (e.g., e-silicon germanium SiGe) is formed, an oxide fill is performed, the gate structure is removed to create channel 24, and the oxide layer within in channel 24 is recessed to yield gate/channel fin(s) 28.

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor device, comprising:
    forming a dummy gate stack and a set of spacers on an oxide-fin surface, the oxide-fin surface comprising a uniform surface;
    performing a recessing of at least a portion of the oxide-fin surface adjacent the dummy gate stack, wherein the at least a portion of the oxide-fin surface is recessed to a depth below the gate structure;

growing an epitaxial layer after the recessing, wherein the epitaxial layer is grown on the at least a portion of the oxide-fin surface; and removing the dummy gate stack from between the set of spacers.

2. The method of claim 1, further comprising performing an oxide fill after the growing.

3. The method of claim 1, further comprising recessing the oxide fin surface between the set of spacers after the removing to reveal a set of fins.

4. The method of claim 1, the set of spacers being positioned proximate opposing sides of the gate stack.

5. The method of claim 1, the performing comprising performing a unified recessing of the oxide-fin surface.

6. The method of claim 1, the performing comprising performing a selective recessing to expose a set of fins in the oxide-fin surface.

7. The method of claim 1, the semiconductor device comprising a FinFET device.

8. The method of claim 1, the oxide-fin surface being formed by:
forming a set of fins in the semiconductor device;
filling a set of gaps between the set of fins with an oxide; and
polishing the oxide to a top surface of the set of fins to yield the uniform surface.

9. The method of claim 1, further comprising a semiconductor device formed according to the process of claim 1.

10. A method of forming a semiconductor device, comprising:
forming a uniform, oxide-fin surface;
forming a dummy gate stack between a set of spacers on the uniform, oxide-fin surface;
recessing at least a portion of the uniform, oxide-fin surface adjacent the dummy gate stack, wherein the at least a portion of the oxide-fin surface is recessed to a depth below the gate structure;
growing an epitaxial layer after the recessing, wherein the epitaxial layer is grown on the at least a portion of the oxide-fin surface; and
removing the dummy gate stack from between the set of spacers.

11. The method of claim 10, further comprising performing an oxide fill between after the growing.

12. The method of claim 10, further comprising recessing the uniform, oxide fin surface between the set of spacers after the removing to reveal a set of fins.

13. The method of claim 10, the recessing comprising a unified recessing of the uniform, oxide-fin surface.

14. The method of claim 10, the recessing comprising a selective recessing of the uniform, oxide-fin surface to expose a set of fins in the uniform, oxide-fin surface.

15. The method of claim 10, the semiconductor device comprising a FinFET device.

16. The method of claim 10, the oxide-fin surface being formed by:
forming a set of fins in the semiconductor device;
filling a set of gaps between the set of fins with an oxide; and
polishing the oxide to a top surface of the set of fins to yield the uniform, oxide-fin surface.

17. The method of claim 10, further comprising a semiconductor device formed according to the process of claim 1.

18. A method of forming a semiconductor device, comprising:
forming a uniform, oxide-fin surface;
forming a dummy gate stack between a set of spacers on the uniform, oxide-fin surface;
recessing at least a portion of the uniform, oxide-fin surface adjacent the dummy gate stack, wherein the at least a portion of the oxide-fin surface is recessed to a depth below the gate structure;
growing an epitaxial layer after the recessing, wherein the epitaxial layer is grown on the at least a portion of the oxide-fin surface;
performing an oxide fill between after the growing;
removing the dummy gate stack from between the set of spacers; and
recessing the uniform, oxide fin surface between the set of spacers after the removing to reveal a set of fins.

19. The method of claim 18, the recessing comprising a unified recessing of the uniform, oxide-fin surface.

20. The method of claim 18, the recessing comprising a selective recessing of the uniform, oxide-fin surface to expose a set of fins in the oxide-fin surface.

* * * * *